United States Patent [19]

Scheibner

[11] Patent Number: 5,194,818
[45] Date of Patent: Mar. 16, 1993

[54] RISETIME AND FALLTIME TEST SYSTEM AND METHOD

[75] Inventor: Harry J. Scheibner, San Jose, Calif.

[73] Assignee: National Semiconductor Corporation, Santa Clara, Calif.

[21] Appl. No.: 661,826

[22] Filed: Feb. 27, 1991

[51] Int. Cl.$^5$ .............................................. G01R 27/00
[52] U.S. Cl. .................................... 324/617; 324/612
[58] Field of Search ............... 324/102, 612, 617, 619; 307/350, 351; 328/115, 151

[56] References Cited

U.S. PATENT DOCUMENTS

| 3,505,598 | 4/1970 | Merrill | 324/102 |
|---|---|---|---|
| 3,585,500 | 6/1971 | Grubel | 324/102 |
| 3,634,755 | 1/1972 | Nicolson | 324/612 |
| 4,245,169 | 1/1981 | Hamilton | 324/102 X |
| 4,791,404 | 12/1988 | Hollister | 324/102 X |

OTHER PUBLICATIONS

"LH4180 High Frequency Voltage Sampler" *National Semiconductor*, Dec. 1989, pp. 1-12.
"AD9500 Digitally Programmable Delay Generator" *Analog Devices*, pp. 9-42 thru 9-90.
"High Frequency Settling Time Measurements," Howard K. Schoenwetter, *IEEE Transaction On Instrumentation and Measurement*, vol. IM-32, No. 1, Mar. 1983, pp. 22-37.
"Settling Time Measurements," Howard K. Schoenwetter, in Digital Methods in Waveform Metrology, B. A. Bell, Ed., National Bureau of Standards, Gaithersburg Md., NBS Special Publ. 707, Oct. 1983.
"A Programmable Precision Voltage-Step Generator for Testing Waveform Recorder", Howard K. Schoenwetter, *IEEE Transactions on Instrumentation and Measurement*, vol. IM-33, No. 3, Sep. 1984, pp. 196-200.
"Design and Characterization of a Programmable Step Generator with Very Fast Settling Performance," H. D. Schoenwetter, *IEEE Transactions on Instrumentation and Measurement*, vol. IM-36, No. 2, Jun. 1987, pp. 428-432.
"Sampling Tracker Makes Short Work of 0.01% Settling-Time Test," Ralph Andersson, *National Semiconductor Corp.*, Published EDN Sep. 17, 1990, pp. 185-196.

*Primary Examiner*—Jack B. Harvey
*Attorney, Agent, or Firm*—Steven F. Caserza

[57] ABSTRACT

A generator provides a repetitive pattern which is applied to the input of a DUT and to the input of a timing generator. The output of the DUT follows the pattern at the input, switching the voltage between two levels. The High Frequency Voltage Sampler measures instantaneous voltage levels on the output waveform of the DUT. The timing generator uses the input signal to generate enable signals for the High Frequency Voltage Sampler which are synchronized to the test waveform and which can be time-delayed in precise intervals and with good repeatability. By placing this signal at a desired point anywhere along the test waveform the voltage at this point can be measured by the High Frequency Voltage Sampler. The High Frequency Voltage Sampler uses the leading edge of the enable signal to start the measurement of the instantaneous voltage level and it uses the trailing edge to store this level. This process is repeated, based on the sampling rate of the High Frequency Voltage Sampler, until the time delay of the enable signal is changed to another measurement point. The repetitive sampling allows the use of a voltmeter to measure the voltage when connected to the output of the High Frequency Voltage Sampler. A computer relates the measurements taken with the program steps of the timing generator to calculate the risetime or the falltime of the DUT.

7 Claims, 15 Drawing Sheets

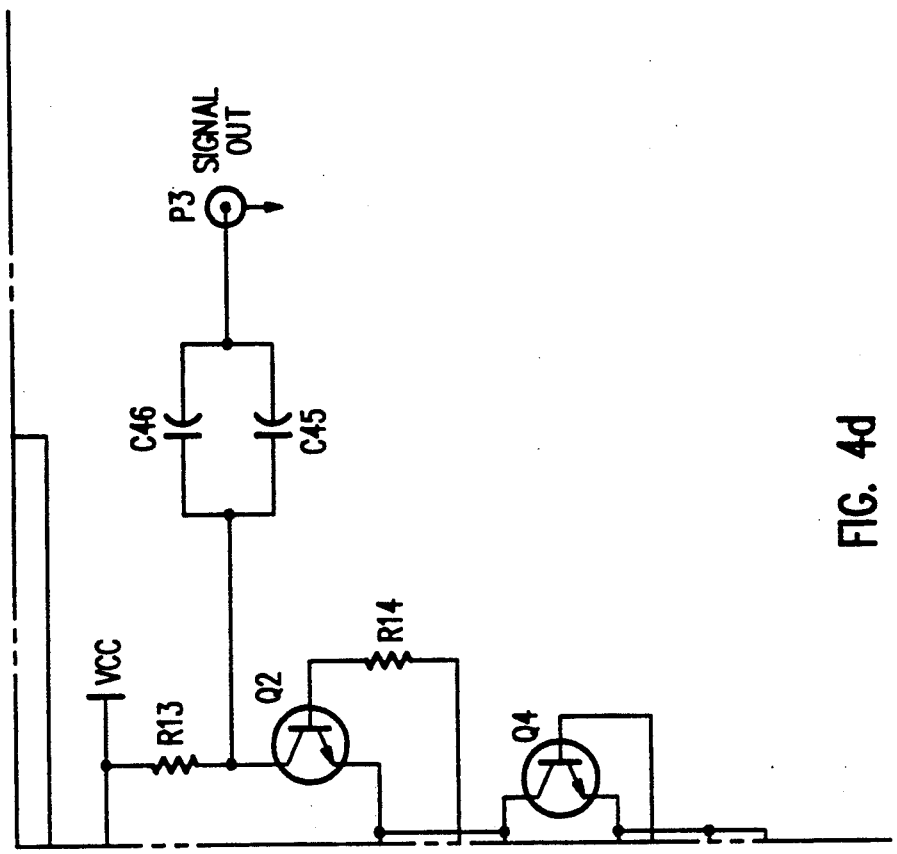
FIG. 4d
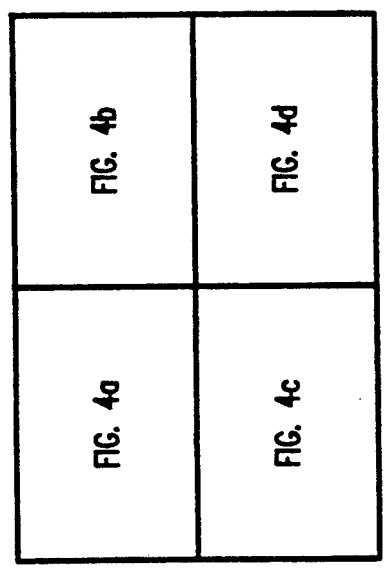
KEY TO FIG. 4

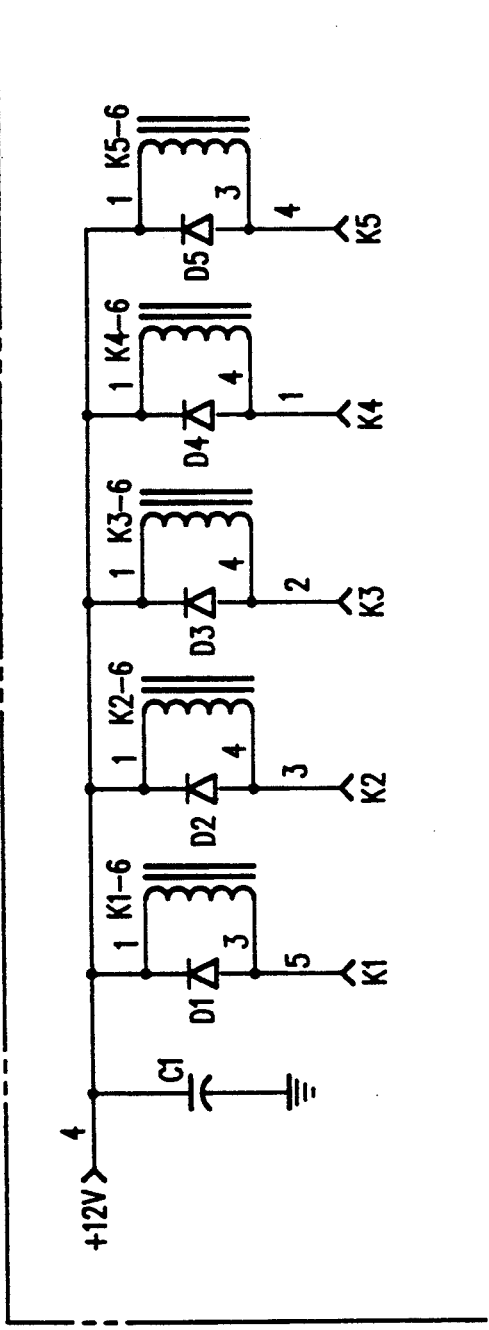
FIG. 5g
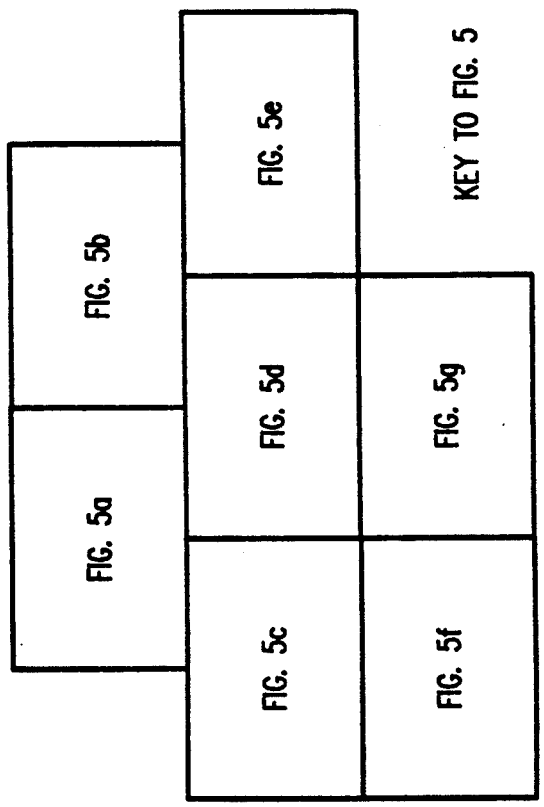
KEY TO FIG. 5

RISETIME AND FALLTIME TEST SYSTEM AND METHOD

INTRODUCTION

Background

This invention pertains to electronic testing, and more particularly to electronic testing of risetimes and falltimes in an electronic signal.

The concept of a Sample Voltage Tracker (SVT) has been known since 1975. It allows the recording of high speed repetitive waveforms with a handful of electronic circuit elements. The SVT's potential has been recognized for measuring voltage transitions. Publications exist that deal with the aspect of measuring settling time in Sample and Hold (S/H) circuits and Digital to Analog (D/A) converters.

The recent development of a commercial SVT device, the LH4810 manufactured and sold by National Semiconductor Corporation designated as "High Frequency Voltage Sampler", made it possible to build an automatic risetime and falltime test system that is relatively simple and very inexpensive. It can measure risetime or falltime to better than 2 ns with a resolution of 20 ps in less than 5 seconds. The only equipment needed in addition to the LH4810 is a computer, such as a suitable typical personal computer, and a digital volt meter (DVM). Shorter test times are possible when a dedicated hardware controller is used in place of the software controller.

The risetime is usually defined as the time required for a signal to transit from a 10% value to a 90% value of its amplitude. The falltime is the time needed to go from 90% to 10% of the signal'a amplitude, as shown in FIG. 1. To measure the risetime and falltime of a device, a minimal test set-up (such as is shown in FIG. 2) consists of source 201, such as a square wave generator, that applies a suitable signal to the input of Device Under Test ("DUT") 202 and oscilloscope 204 connected to the output of DUT 202.

The use of an automatic digital oscilloscope can simplify the entire risetime and falltime measurement to the pushing of a few buttons. The test result is available in a few seconds. This eliminates the interpretation of the scope reading by an operator, removing a potential source of error. The scope can be connected via a bus structure, such as IEEE-488, to a computer or to an automatic test system. As expected, such elegance and convenience for use at higher frequencies comes with a price tag. The typical price range for an automatic digital oscilloscope with a bandwidth of over 1 GHz is $20,000 to $30,000. Needless to say, the oscilloscope can do a lot more than only measure risetime and falltime.

As with all measurements, care must be taken to choose test equipment whose performance specifications keep the error in the test result to an acceptable level. The test signal source must have a risetime and falltime that is shorter than the expected risetime and falltime of the DUT. The oscilloscope must have a timebase with sufficient resolution at the expected risetime and falltime of the DUT and a vertical amplifier with a bandwidth that exceeds the equivalent risetime and falltime of the DUT. The bandwidth BW can be expressed in risetime tr for this purpose as:

$$BW = \frac{0.35}{tr} \quad (1)$$

For example, a vertical amplifier with 1 GHz bandwidth has an equivalent risetime of 350 ps.

Oscilloscope manufacturers recommend the use of equipment with at least four times the bandwidth (0.25×risetime) of the DUT figures. This limits the error to approximately 3%.

The combined effect of the square wave generator, oscilloscope and DUT risetimes can be evaluated with the formula:

$$tr = \sqrt{tr(DUT)^2 - tr(SYS)^2} \quad (2)$$

where:
 tr=measured risetime;
 tr(DUT)=risetime of the DUT; and
 tr(SYS)=risetime of the test system, including square wave generator, oscilloscope vertical amplifier, and probe.

When the risetime and falltime of the test equipment approaches that of the expected risetime and falltime of the DUT, the error becomes too large. The same formula can be used to obtain a more accurate test result by subtracting the test system numbers from the test result.

$$tr(DUT) = \sqrt{tr^2 - tr(SYS)^2} \quad (3)$$

For an assessment of other errors, it is necessary to look also at the resolution, the accuracy, and the repeatability of the whole test system in accordance with established test practices.

SUMMARY

A Novel Risetime/Falltime test system is provided. The test system includes a fast signal generator for providing a repetitive input signal, a precision timing generator, and a sample voltage tracker. The signal generator provides a synchronizing clock pulse to the timing generator, as well as the test wave form which is applied to a device under test (DUT). The output signal from the DUT is presented to the high frequency voltage sampler. The timing generator provides short enable pulses used by the high frequency voltage sampler to sample instantaneous voltage levels of the DUT output waveform. In one embodiment, the timing generator is constructed from a programmable coarse and a programmable fine delay element, thereby allowing the enable pulses to be positioned accurately anywhere along the DUT output waveform. A simple, inexpensive voltmeter is used to measure the output signal from the high frequency voltage sampler, which readings are then used to determine appropriate voltage level points along DUT output waveform in order to calculate the risetime or falltime being measured. In one embodiment of this invention, a typical computer test system is used in place of the voltmeter, allowing risetimes and falltimes to be conveniently measured as one of a series of test including, for example DC parametric and functionality testing.

BRIEF DESCRIPTION OF THE DRAWING

FIGS. 4a–4d are schematic diagrams of one embodiment of a square wave generator suitable for use as the signal generator in accordance with the teachings of this invention;

FIGS. 5a–5g are schematic diagrams of one embodiment of a timing generator suitable for use in accordance with the teachings of this invention;

DETAILED DESCRIPTION

Figure 1:
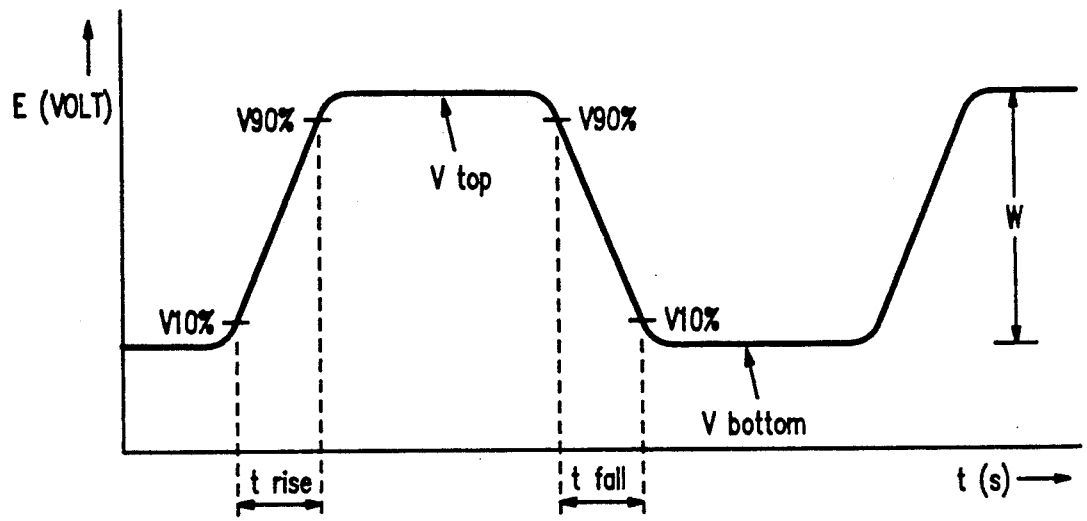
FIG. 1 is a graph depicting an electronic signal, and points from which its risetime and falltime are measured.
Figure 2:
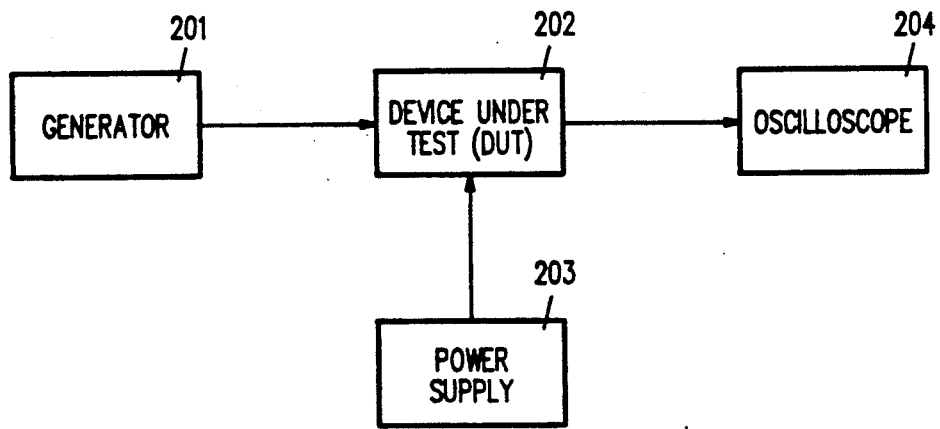
FIG. 2 is a block diagram depicting a typical risetime/falltime measurement system of the prior art.
Figure 3:
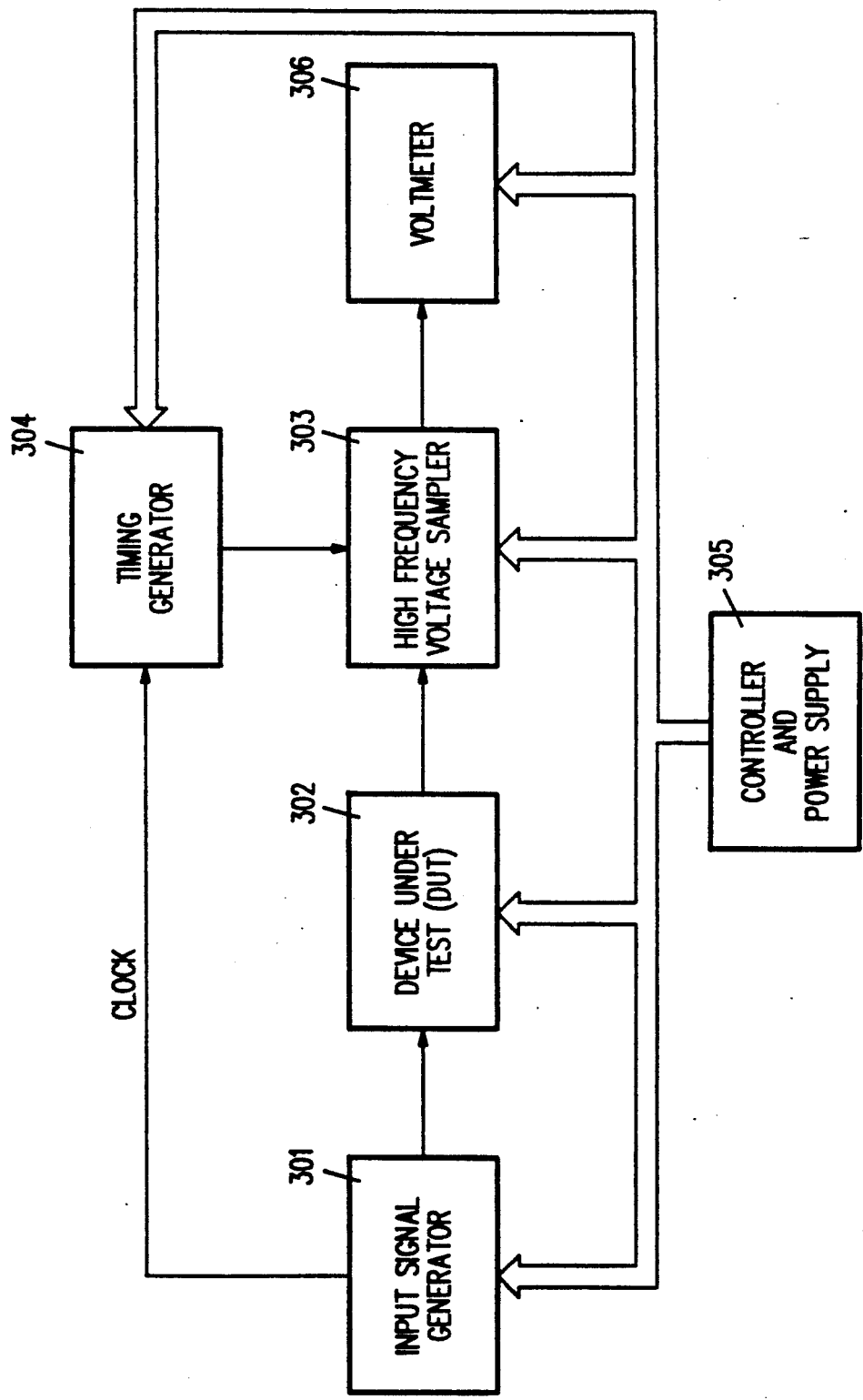
FIG. 3 is a block diagram depicting a risetime/falltime measurement system constructed in accordance with the teachings of this invention.
Figure 4A:
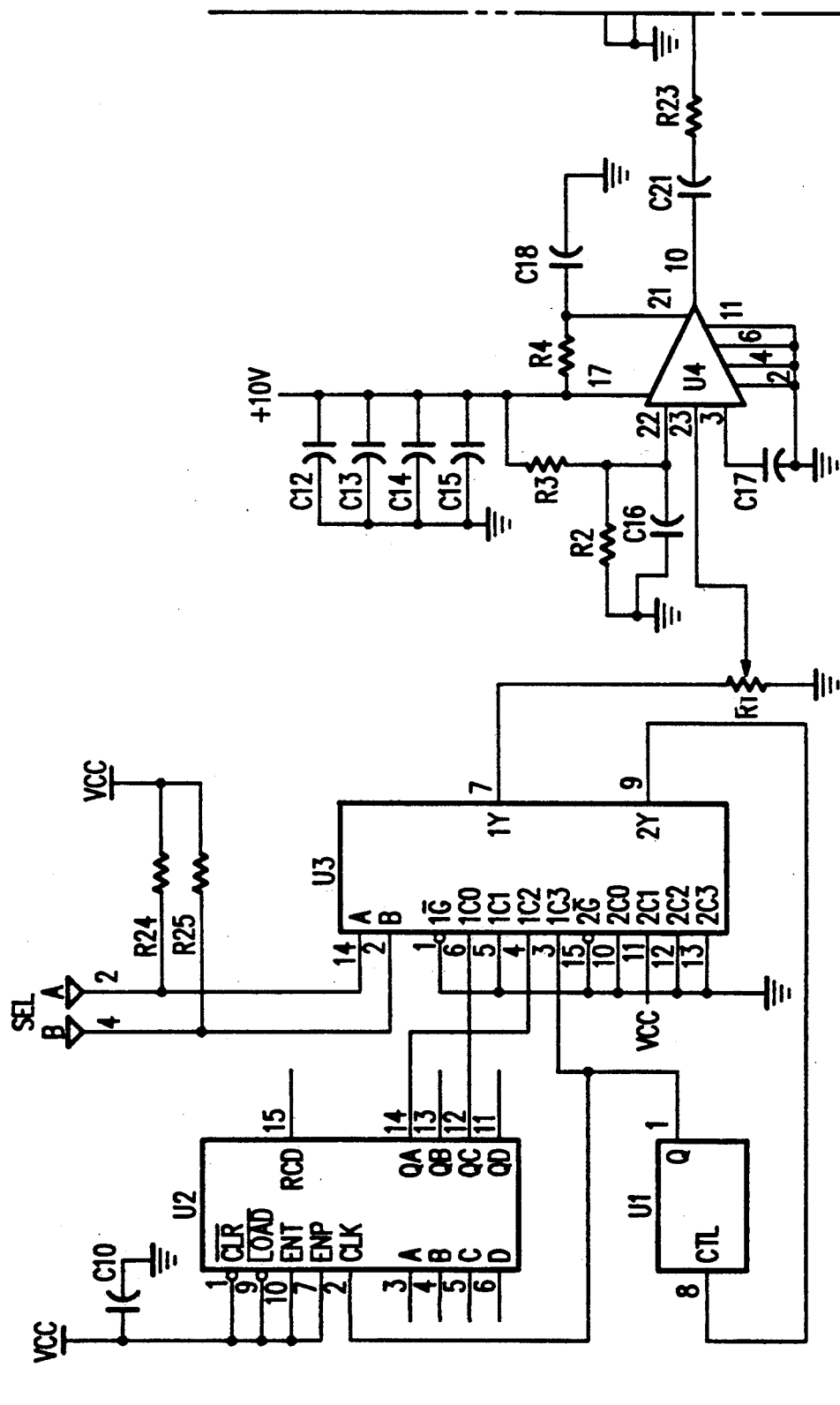
Figure 4B:
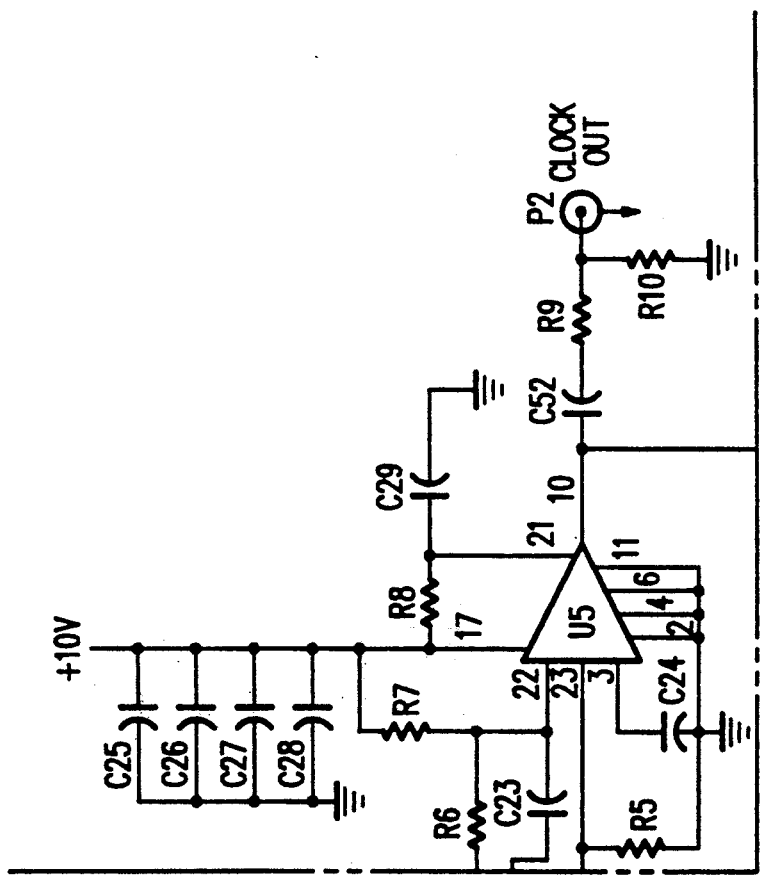
Figure 4C:
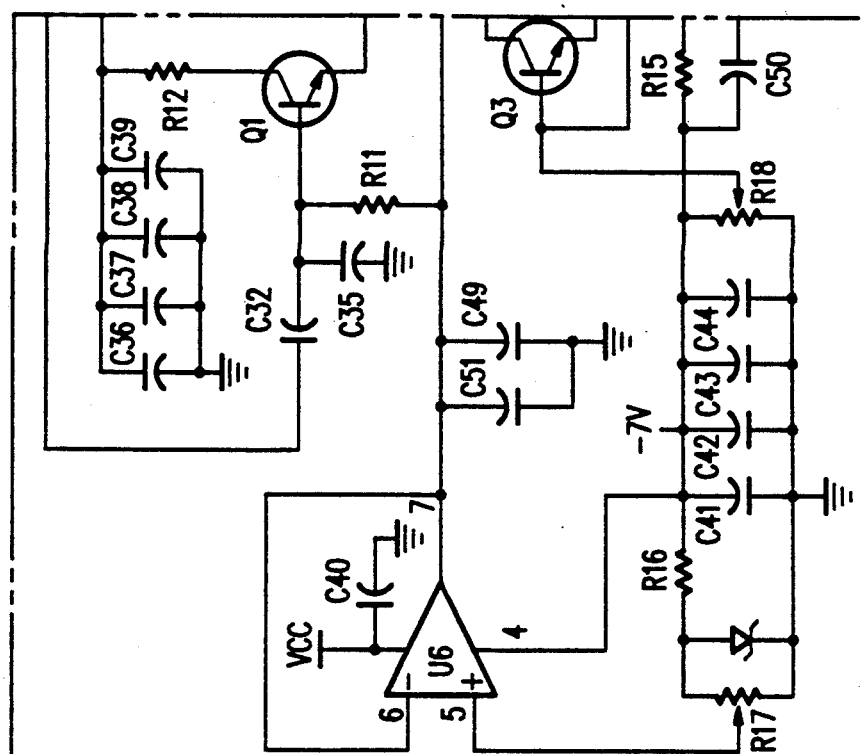
Figure 4C:
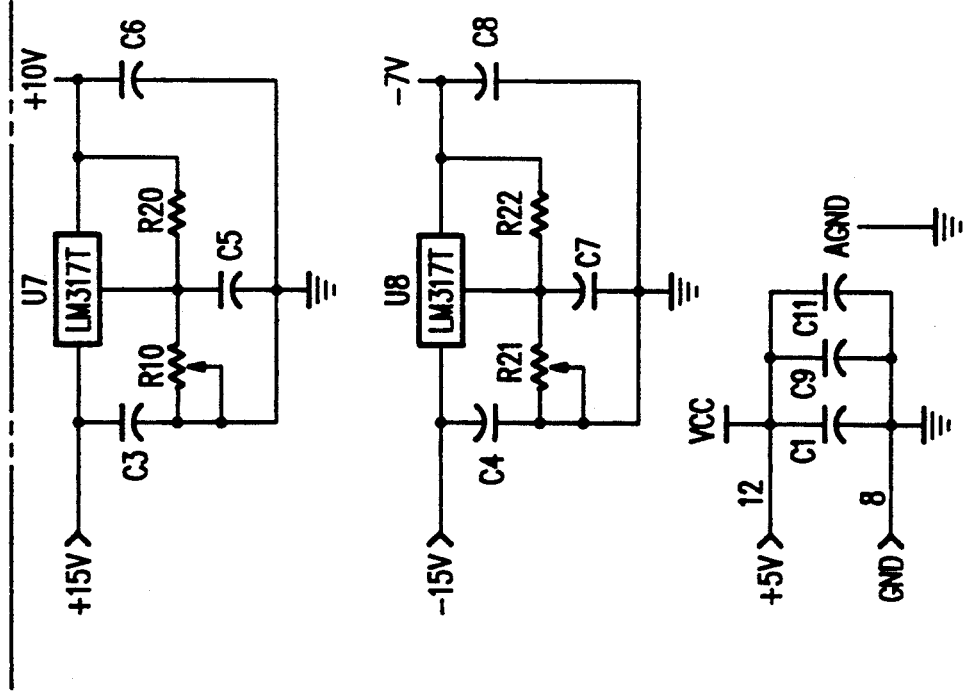
Figure 5A:
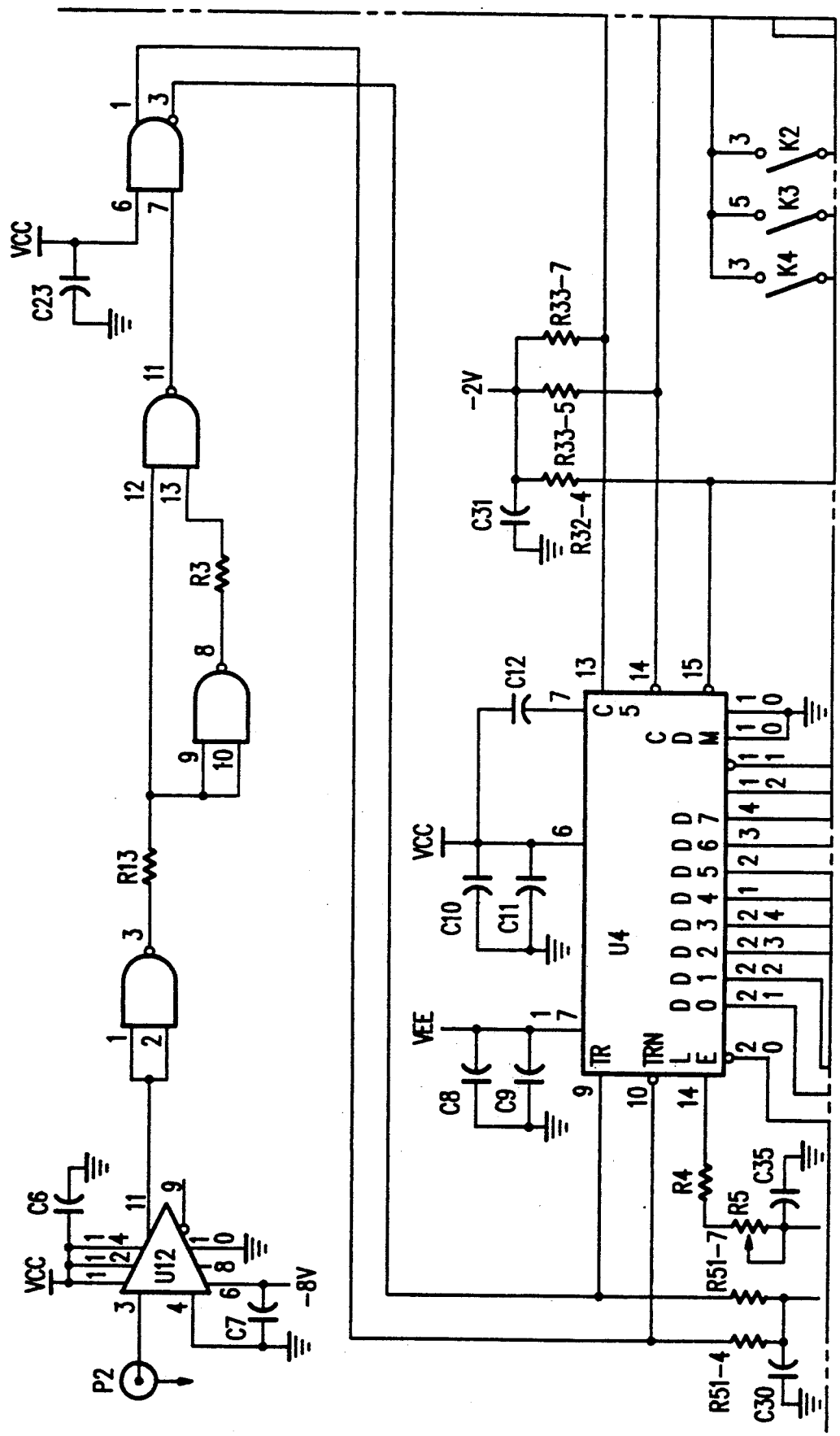
Figure 5B:
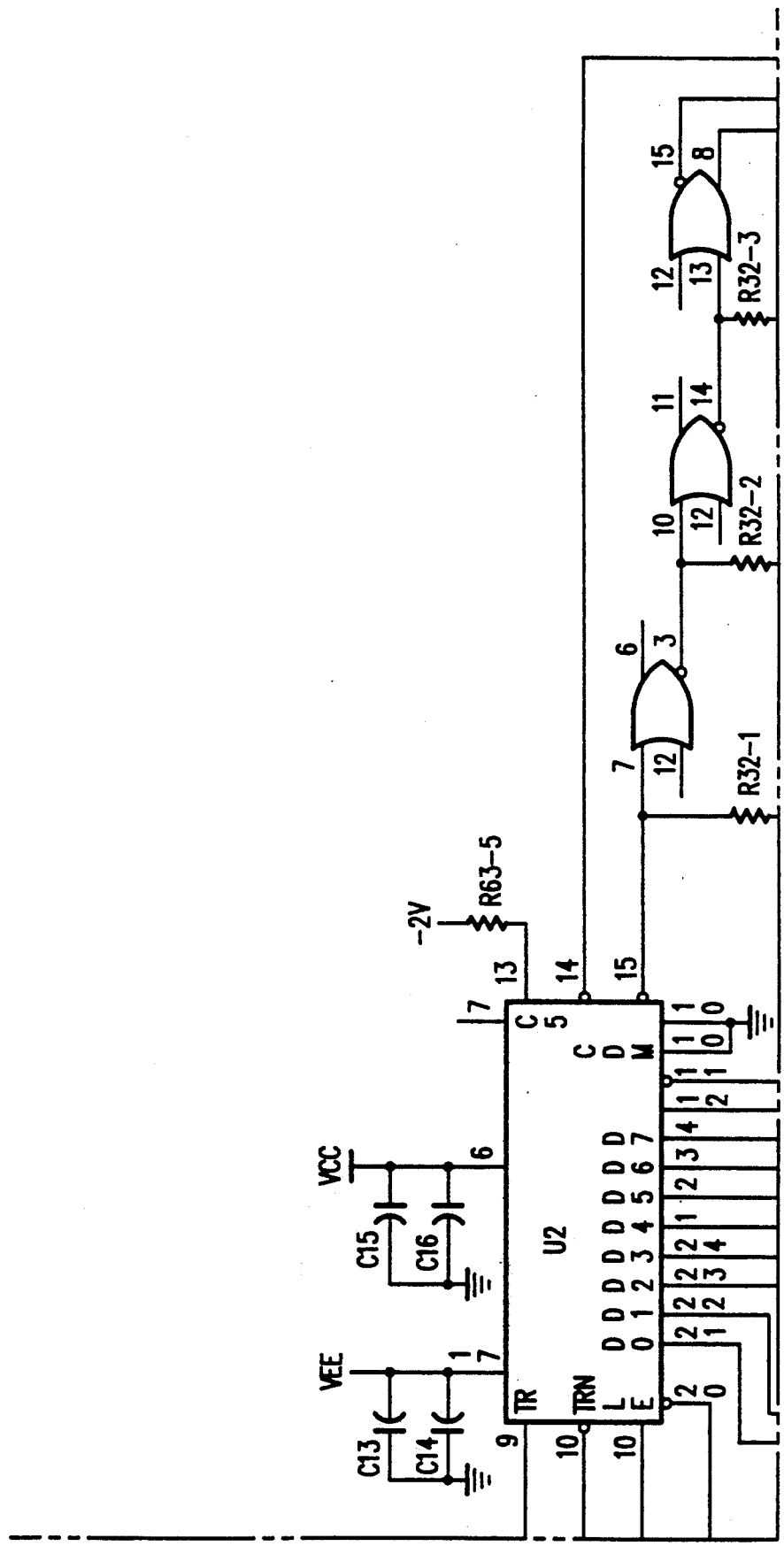
Figure 5C:
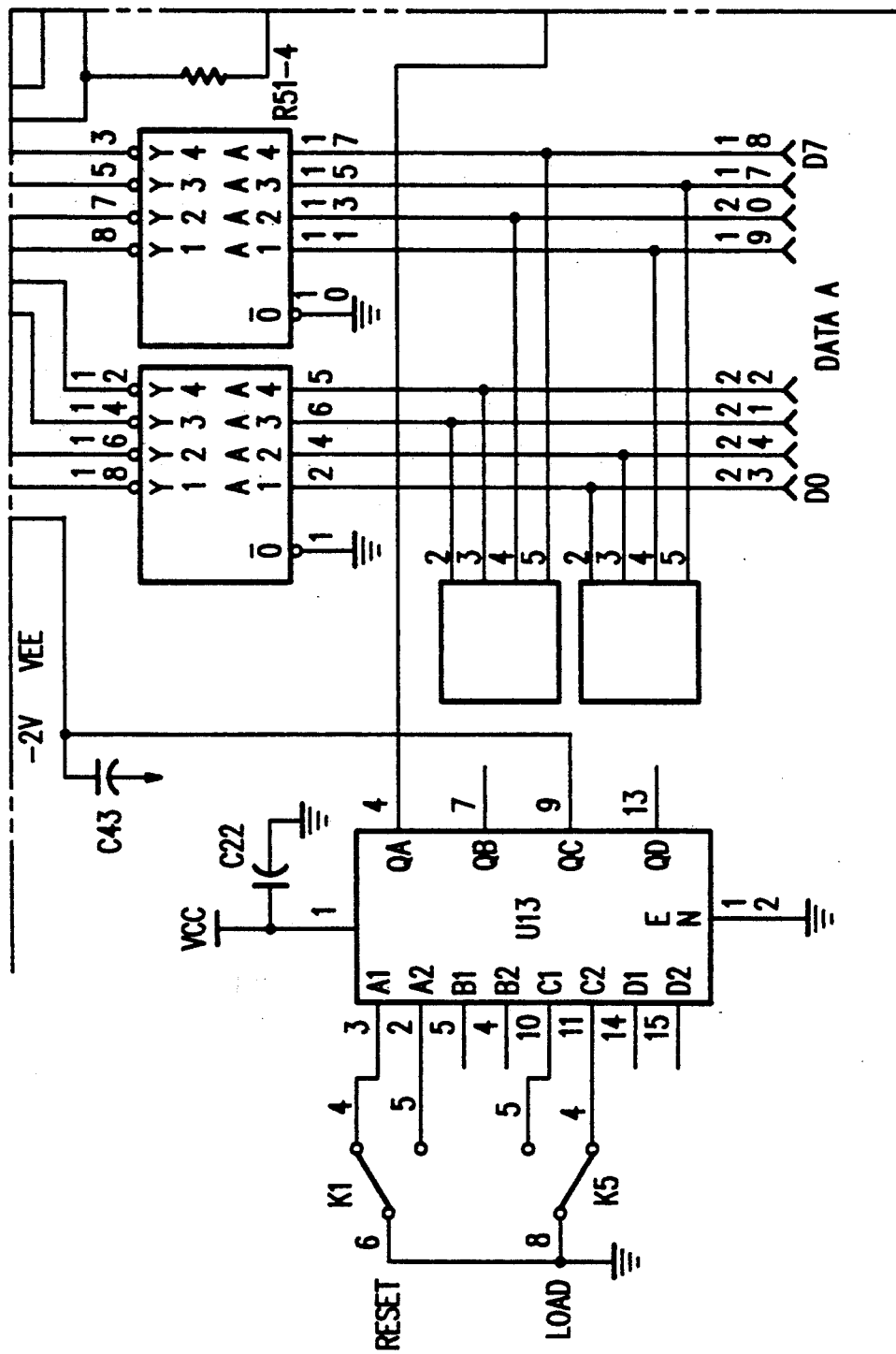
Figure 5D:
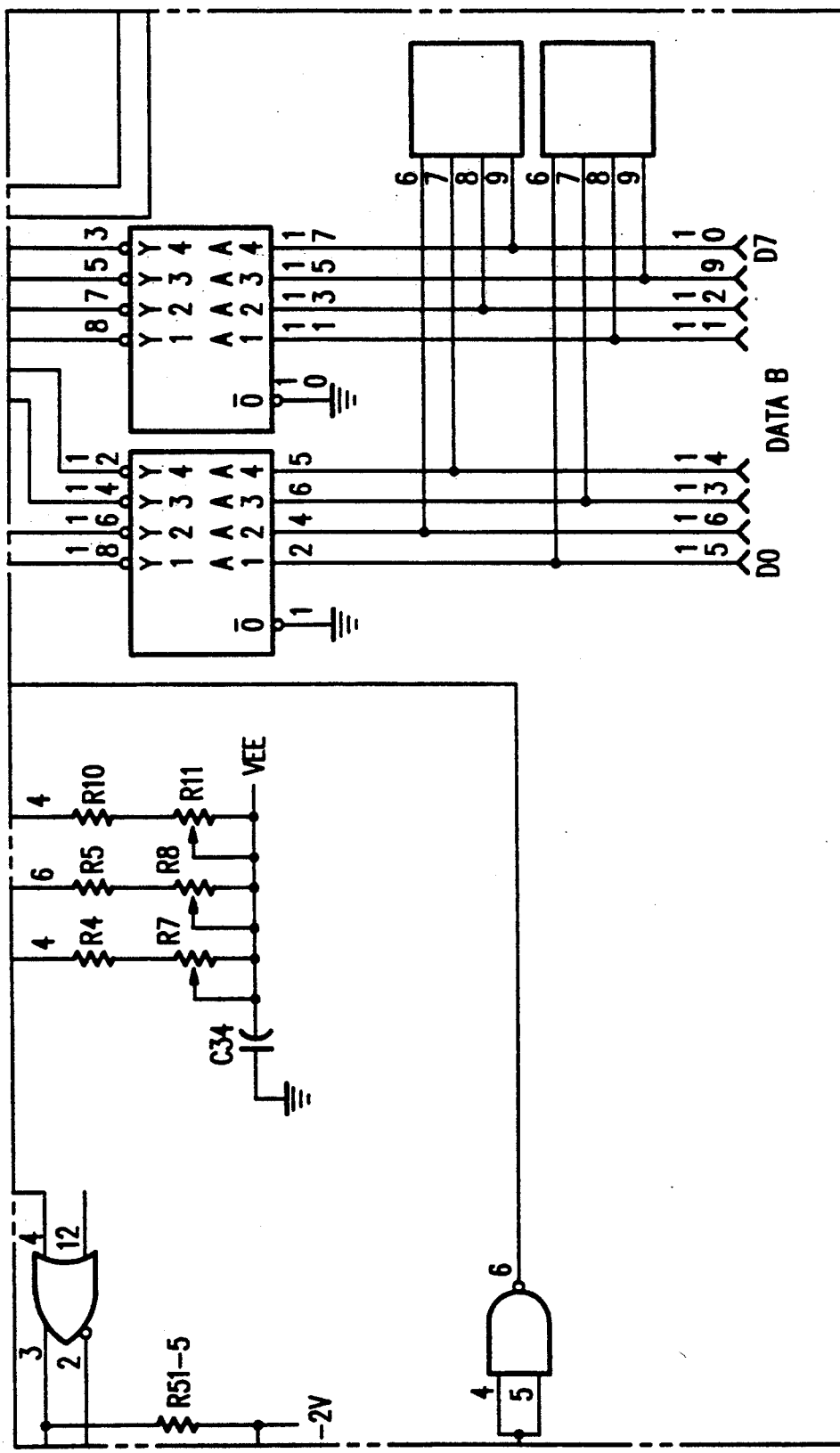
Figure 5E:
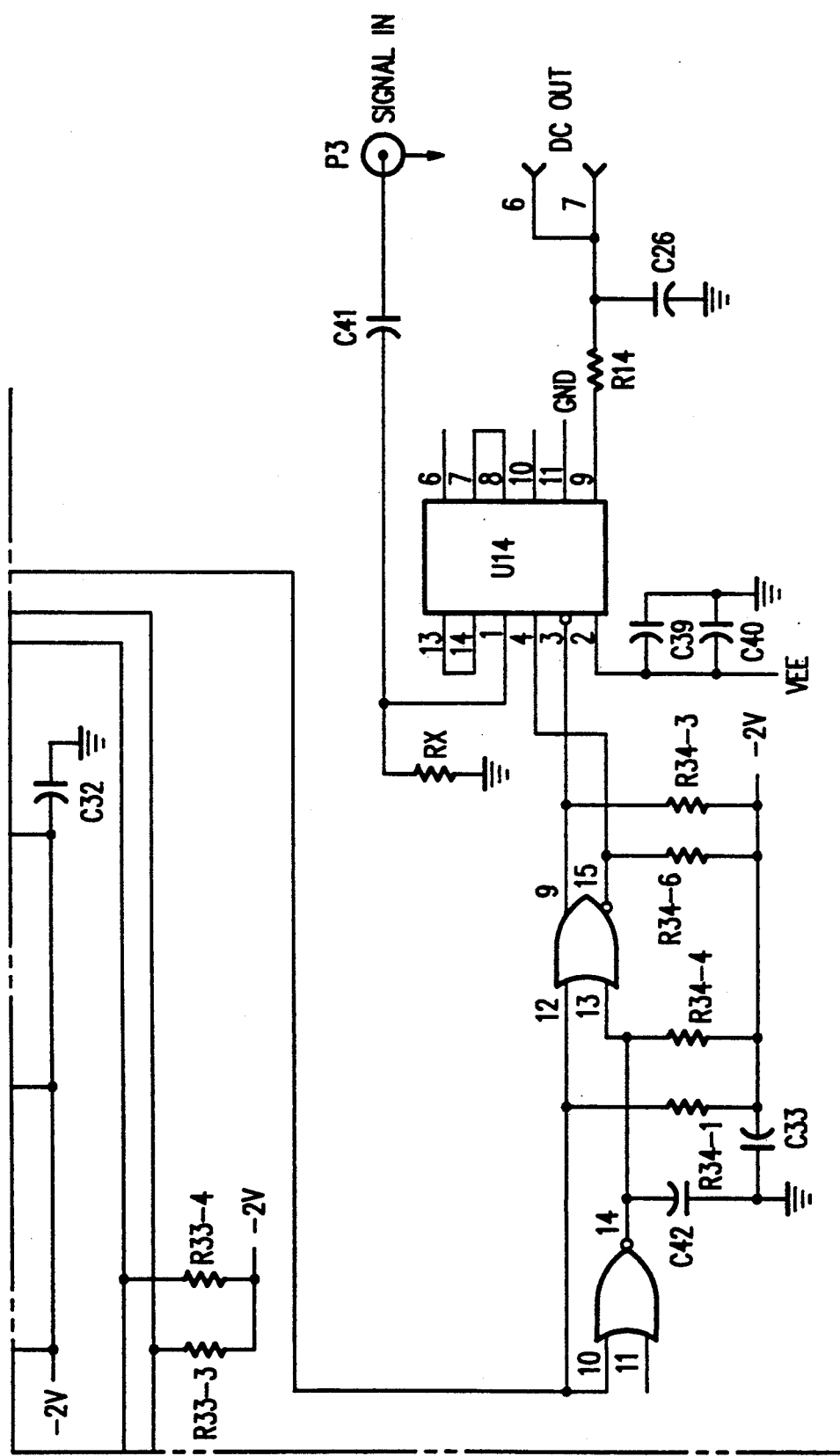
Figure 5F:
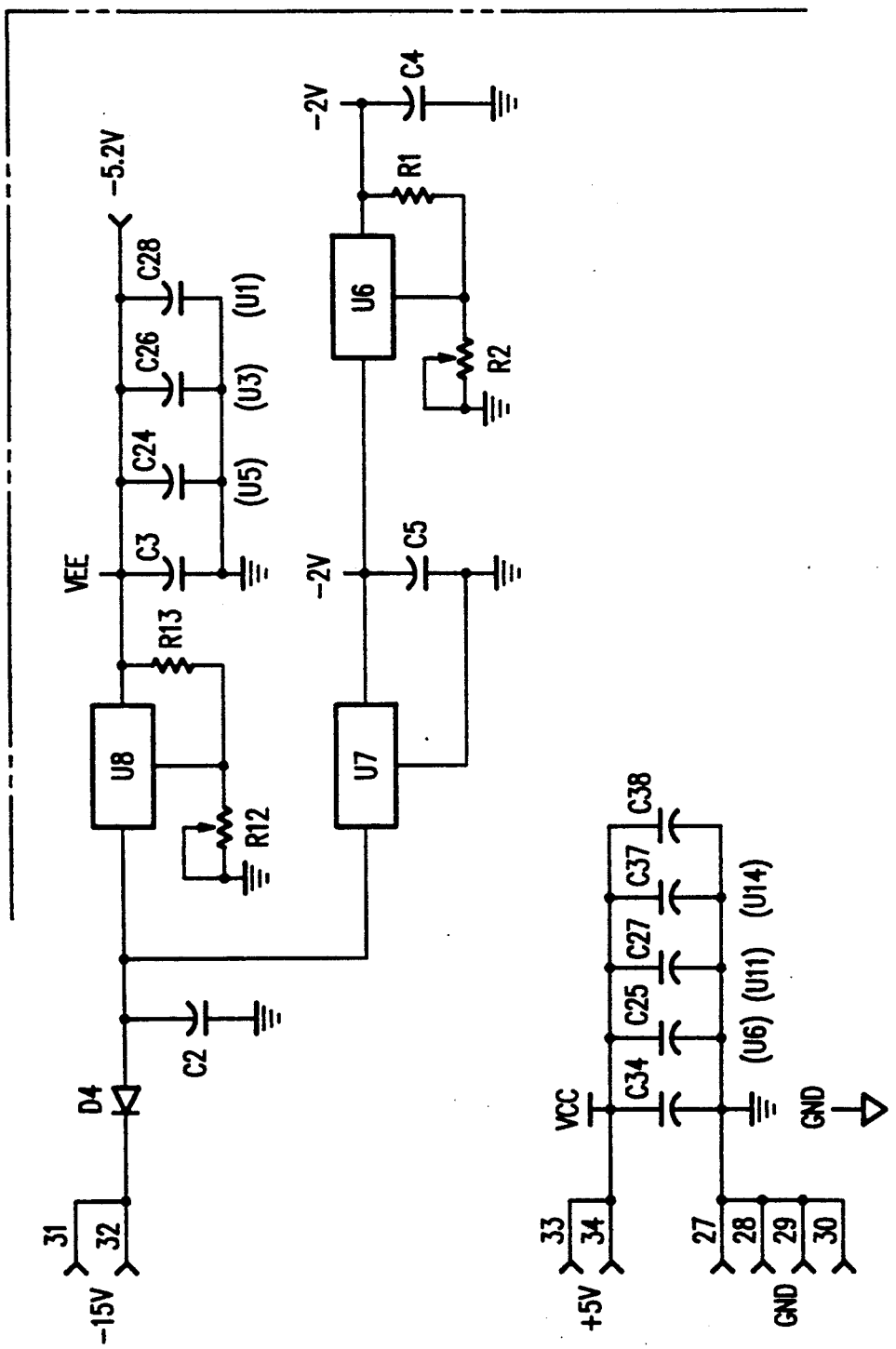

In accordance with the teachings of this invention, a novel risetime/falltime test system 300 (as shown in FIG. 3), includes fast Input Signal Generator 301, precision Timing Generator 304, High Frequency Voltage Sampler 303 (also referred to as Sample Voltage Tracker elsewhere), Voltmeter 306 (which comprises, for example, a digital voltmeter), and Controller and Power Supply 305.

In one embodiment of this invention High Frequency Voltage Sampler 303 is provided by an LH4810 device available from National Semiconductor. Input Signal Generator 301 provides a repetitive input signal which serves as synchronizing clock pulses to Timing Generator 304 and the test waveform to Device Under Test (DUT) 302. In one embodiment, Input Signal Generator 301 is a Square Wave Generator. The output from DUT 302 is presented to High Frequency Voltage Sampler 303. Timing Generator 304 creates a short enable pulses for High Frequency Voltage Sampler 303. These pulses track and sample instantaneous voltage levels of the output waveform which comes from DUT 302. A plurality of reading may be taken at the same locations on the repetitive output signal, with accurate timing of the location of the voltage reading being assured by a stable, repetitive input signal provided by Input Signal Generator 301.

By constructing Timing Generator 304 from programmable coarse and programmable fine delay elements, the enable pulses can be positioned precisely anywhere along the output waveform coming from DUT 302, allowing precise timing measurements to be made with respect to locations of selected voltage levels on the output waveform. Voltmeter 306 reads the DC voltage at the output of High Frequency Voltage Sampler 303. Controller 305 contains a program which supplies all required voltages and currents to DUT 302, selects clock and test frequency in Input Signal Generator 301, supplies Timing Generator 304 with data which programs its time delays, reads information from Voltmeter 306, stores this data and performs calculations (as needed) to obtain test results.

In one embodiment of this invention Controller 305 is conveniently a commercially available computerized test system designed for the purpose of testing semiconductor components. In one embodiment a "Teradyne" testing system is used as Controller 305, thereby conveniently allowing the computer test system to test DC and functional operation of a DUT and serve as controller 305 in accordance with this invention.

The use of a risetime/falltime test system as constructed in accordance of the teachings of this invention has widespread commercial application. For example, National Semiconductor Hybrid Systems has developed a line of high performance Cathode Ray Tube (CRT) Drivers, which include single channel units with risetime and falltimes of 10 ns to less than 2 ns for black and white or color high resolution monitors, three channel devices for color monitors, and devices which combine video amplifiers with the CRT drivers in single and three channel versions. All devices have in common high voltage and high frequency amplifiers, and among their most important parameters are their risetime and falltime. During development and pilot production, the risetimes and falltimes were measured on the bench by using a pulse generator and a 1 GHz analog oscilloscope. Later a more convenient 20 GHz digital oscilloscope programmed by an engineering computer was used.

For production testing several of these test set-ups are usually required, therefore a more cost effective solution is desirable. A dedicated risetime and falltime test system was developed that makes use of existing DC test stations. These run the test program, supply the various DC test voltages, and make DC measurements.

Figure 7:
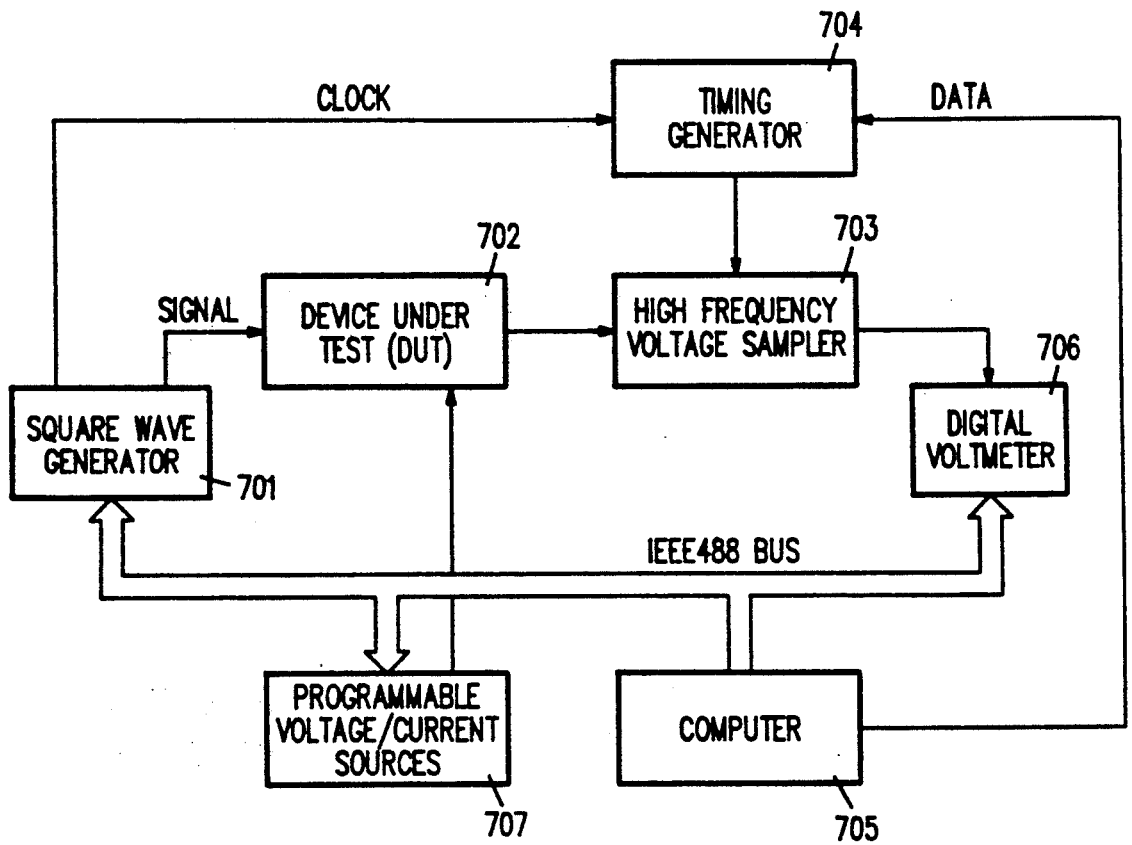
FIG. 7 is a block diagram of one embodiment of this invention constructed partially from commercially available elements compatible with an IEEE-488 bus system.
Figure 8:
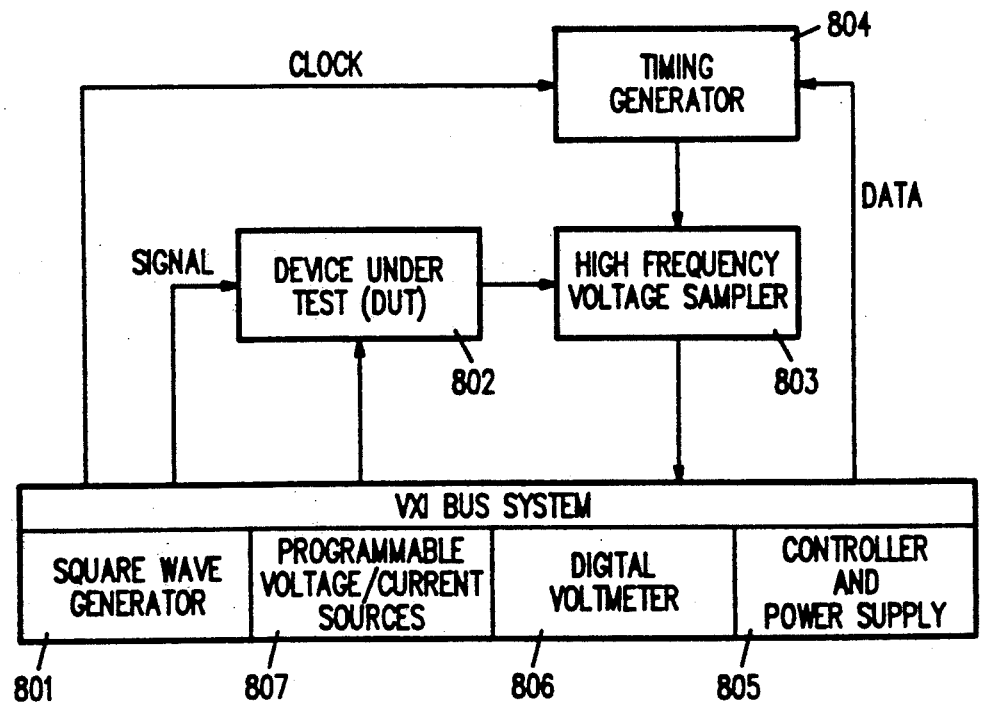
FIG. 8 is a block diagram of one embodiment of this invention constructed partially from commercially available elements compatible with a VXI bus system.

In place of the commercial DC test system in one embodiment, as shown in FIG. 7, a PC with digital INPUT/OUTPUT (I/O) drive capability and an IEEE-488 bus connected DC voltmeter is used to make an automatic risetime and falltime test station. Another embodiment (shown in FIG. 8) includes the use of a XVI bus system which is equipped with a signal source, switching modules, voltage sources and a DC voltmeter. In each of these embodiments, a software program controls the test sequence, the application of voltages and the reading and interpretation of the test results.

In one embodiment, square wave generator 301 is constructed on a 3.5"×3.5" PC board and produces a waveform that has approximately 1 ns risetimes and falltimes at a repetition rate of 6.25 MHz and delivers 2.4 Vpp into 50 Ohm. 25 and 50 MHz waveforms are also available for other AC testing, such as gain, linearity, and power dissipation tests. In this embodiment, timing generator 304 with High Frequency Voltage Sampler 303 is constructed on a 3.5"×4.5" PC board. Timing is digitally controllable in increments down to 20 ps by the test program run by controller 305.

CIRCUIT DESCRIPTION

Square Wave Generator

One embodiment of Input Signal Generator 301 suitable for use in accordance with the teachings of this invention is shown in the schematic diagram of the square wave generator of FIG. 4. TTL level square wave module U1 delivers a 50 MHz signal to DIVIDER U2, which is followed by 4 to 1 data selector U3. Data bits A and B select 50 MHz, 6.25 MHz, or no signal (ground) at output lead 7 of data selector U3. In one embodiment, 6.25 MHz is selected for risetime and falltime testing. Potentiometer R1 is set to provide an input voltage level of approximately 0.25 Vpp to limiter U4. In one embodiment, limiter U4 comprises a LH4200 gallium arsenide 1 GHz amplifier available from National Semiconductor Corporation. The open loop gain of limiter U4 is set by a fixed bias of 1.4 volt from resistors R2 and R3.

The AC coupled second limiter U5 circuit is similar to first limiter circuit U4. The output of limiter U5 is AC coupled to a driver which includes transistors Q1 and Q2. Transistors Q3 and Q4 are connected in parallel and serve as a current source to transistor pair Q1, Q2. The drive current through transistors Q3, Q4 is set with potentiometer R18 to approximately 95 mA, which results in a signal amplitude of approximately 2.4 Vpp at output connector P3, when terminated in a 50 Ohm load (not shown).

With this setting of potentiometer R18 the power dissipation limit of transistors Q1, Q2, Q3, Q4 is not exceeded, when transistors Q1 through Q4 each comprise NE85637 devices. If higher signal levels are required on output connector P3, different devices, having higher power dissipation and current rating, are selected for transistors Q1, Q2, Q3, Q4.

The natural falltime of the embodiment of FIG. 5 is about twice as fast as the risetime. In this embodiment, capacitor C35 is selected to provide nearly symmetrical risetimes and falltimes at output connector P3. The value of capacitor C35 is typically between 20 and 30 pF, depending on the specific characteristics of transistors Q1 and Q2.

A stable bias supply for transistors Q1, Q2 is obtained from reference diode D1. The level is set to approximately −1.3 V by potentiometer R17 and then buffered by amplifier U6. Voltage regulators U7 and U8, respectively, supply the required +10 V and −7V for the circuit.

The output signal from limiter U5 is also used after an attenuation of approximately 43:1 provided by resistors R9 and R10 as a synchronizing clock signal on connector P2 for application to Timing Generator 304 (FIG. 3).

Timing Generator

One embodiment of Timing Generator 304 shown in FIG. 3 is depicted in the schematic diagram of FIG. 5. The clock signal arriving on Connector P2 from Square Wave Generator 301 (FIG. 5) synchronizes the timing pulses to the test input clock signal assuring a fixed reference position on the test waveform. U12 is a high speed comparator, which conditions the clock signal from Connector P2 to TTL levels. This is followed by a pulse generator, made up from NAND gates in U6. The low going 10 ns pulse from this circuit appears at pin 7 of TTL or ECL converter U5. The ECL output signal from converter U5 is applied to the input pins of the digitally controlled precision coarse pulse delay circuit U4 which, in this embodiment, is an AD9500 device available from Analog Devices. The full scale delay is determined by capacitor C12 (typically about 20 pF) and resistor R4 (typically about 4.7k Ohms) in series with potentiometer R5 (typically about 500 Ohms). In this embodiment, the values of capacitor C12, resistor R4, and potentiometer R5 are selected to provide a full scale delay of approximately 153 ns. With a full scale delay of 153 ns, an 8 bit digital word allows the selection of 256 steps in 0.6 ns increments.

U10 is a TTL line receiver, which buffers Data A word coming from program controller 305. When relay K5 is momentarily activated by program control, a low going TTL pulse is generated at the output of debounce device U13 and is applied to the enable pin of coarse pulse delay circuit U4, thereby latching the Data A bits into coarse pulse delay circuit U4. Pin 15 of U4 serves to provide a reset signal via gate U3 to reset input leads 11 and 12 of coarse pulse delay circuit U4.

The time delayed ECL output pulse from pins 13 and 14 of coarse pulse delay circuit U4 is applied to input leads 9 and 10 of fine pulse delay circuit U2, which operates in the same way as coarse pulse delay circuit U4, but providing finer increments of delay. One of three relays K2, K3 or K4 selects for fine pulse delay circuit U2 full scale delay ranges of 5.1 ns, 10.2 ns or 20.4 ns, which correspond to increments of 20 ps, 40 ps or 80 ps, respectively. These scales make possible the measurement of a very wide range of expected risetimes and falltimes.

Controlling Data B bits are buffered by circuit U11 and are latched into fine pulse delay circuit U2 by the activation of relay K1. Inverter U6:B is used for added delay to avoid timing conflicts. The reset function on fine pulse delay circuit U2 is implemented by using three gates from device U3, which insure that the minimum timing requirements are met on reset pins 11 and 12 of fine time delay circuit U2.

The AD9500 device references delay to the leading edge of the output pulse and the output pulse width is dependent on the programmed delay. In this embodiment a fixed pulse width is desired. This is implemented with pulse generator U1:3/U1:4, which supplies the latch enable function for the High Frequency Voltage Sampler U14, for example an LH4810 device available from National Semiconductor Corporation. The enable signal is applied to pins 3 and 4 of U14 High Frequency Voltage Sampler. The leading edge puts the device into the tracking mode and the trailing edge locks in the data.

The output from the DUT is the signal on which the risetime and falltime is to be measured. It reaches pin 1 of High Frequency Voltage Sampler U14 from connector P3 and is DC isolated by capacitor C41. For accurate results at fast risetimes and falltimes, terminating resistor Rx is physically placed as close as possible to High Frequency Voltage Sampler U14.

The DC output signal on pin 9 of High Frequency Voltage Sampler U14 goes through a simple low pass filter formed by resistor R14 and capacitor C26 to a suitable measurement device (not shown) such as a digital voltmeter of the measurement system of an automatic test station.

When fast risetimes and falltimes are to be measured with good accuracy and repeatability, the physical layout of the Timing Generator is critical. All precautions for ECL devices should be observed, such as short connections, proper terminations and the use of ground and power planes. In one embodiment of this invention, a printed circuit board having four layers is utilized in order to provide suitable ground, power, and signal planes.

DUT INTERFACING

The requirements of the DUT determine what DC voltages are applied to it and what AC input signal is needed to operate it at specific test conditions. Potentiometer R18 in Square Wave Generator 301 (FIG. 4) sets this level. Equally important is the level of the DUT output signal that reaches High Frequency Voltage Sampler Device U14 on Timing Generator 303 (FIG. 5). The maximum input voltage on pin 1 of an LH4810 device for linear operation is ±2.0 Volt. In one embodiment, the typical DUT output voltage swing is 40 Volts. In this case, a 100:1 resistive voltage divider (not shown) is used, for example made from metal film resistors, to reduce the voltage swing from the DUT output signal to an acceptable input voltage swing for the test circuitry. As will be readily appreciated by those of ordinary skill in the art of measuring, fast risetimes and falltimes, any stray capacitance and inductance must be held to a minimum.

TEST PROCEDURE

The following exemplary description is based on a clock and test frequency of 6.25 MHz (i.e., a 160 ns period).

The test system has timing offsets, which must be known, before a program for a particular DUT can be written. Determination of timing offsets may be made as follows. First, the Data A and Data B values are set low at the data inputs of coarse delay circuit U4 and fine delay circuit U2, so as to provide zero time delays by coarse pulse delay circuit U4 and fine pulse delay circuit U2. The time delay between input clock signal connector P2 and the enable pulse on pins 3 and 4 of High Frequency Voltage Sampler U14 is then measured. This value is the timing offset of the test system. In one embodiment, it was measured as 95 ns.

Virtually the same signal that goes into the Timing Generator is used as an input to the DUT. It is delayed by the transition through the DUT before it is applied to the input of High Frequency Voltage Sampler 303 for risetime and falltime measurement. On National Semiconductor CRT drivers, delay is typically 8 ns. The resulting timing relationship establishes the zero delay point t0, as shown in FIG. 6.

The next step is to determine the amplitude of the waveform to be measured. In a perfect square wave this is simply the absolute value of the voltage level at the top minus the voltage level at the bottom of the waveform. However, actual waveforms from DUTs have imperfections. The most common imperfections are overshoot, undershoot, ringing, and tilt. Overshoot and undershoot are located close to the transition from high to low or vice versa. Ringing reaches more or less into the flat portion of the waveform, while tilt affects the flat portion.

To measure accurately the average top or bottom level of a waveform an infinite number of samples would have to be taken to account for all excursions from the average during one pulse-width after a transition. For practical reasons the number of samples is typically limited and a decision has to be made when a transition starts and when it is finished on the time axis. In most cases any of the above flaws are relatively mild and for the measurement approximately ⅛ to ⅝ to the pulsewidth after a transition is acceptable.

Figure 6:
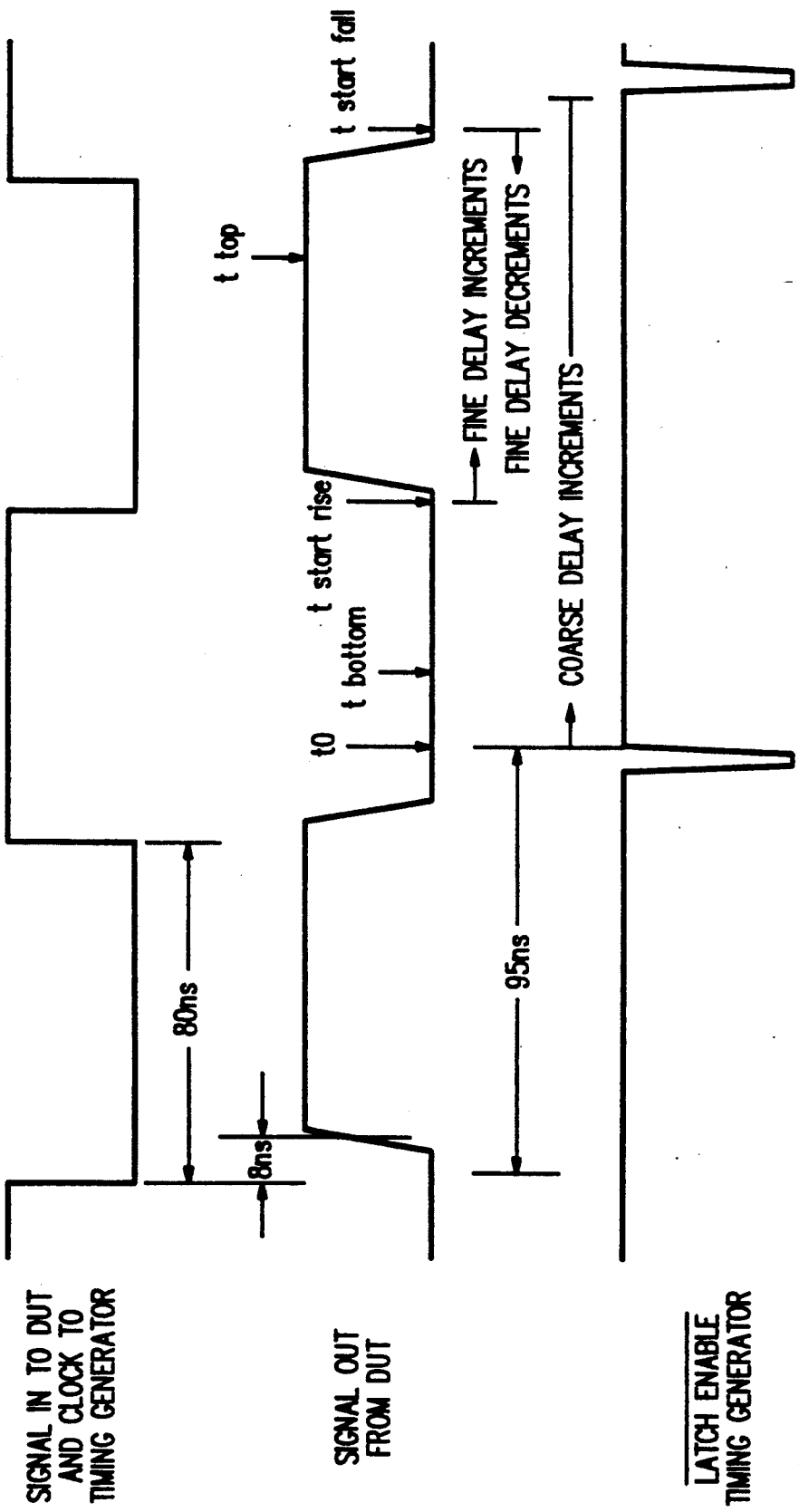
FIG. 6 is a timing diagram depicting the operation of one embodiment of this invention.

Program example, based on FIG. 6.
Data A = coarse delay word, 8 bits, numerical value 0 to 255, 0.6 ps per bit. (Pico-seconds per bit)
Data B = fine delay word, 8 bits, numerical value 0 to 255, 40 ps per bit, Relay K3 activated.

Amplitude

1. Set Data B to 0 (Ons)
2. Set Data A to 30 (18 ns) = t bottom, read and store voltage Vb.
3. Set Data A to 140 (84 ns) = t top, read and store voltage Vt.
4. Calculate amplitude $V = Vt - Vb$
5. Calculate and store $V10 = 0.1V + Vb$ and $V90 = 0.9V + Vb$.

Risetime

6. Set Data A to 68 (40.8 ns) = t start rise, read voltage Vr.
7. If $Vr > V10$, decrement Data A until $Vr < V10$.
8. If $Vr < V10$, increment Data B until $Vr > V10$.
9. Decrement Data B by one bit, store Data B as B10.
10. Increment Data B until $Vr > V90$.
11. Decrement Data B by one bit, store Date B as B90.
12. Calculate $tr = (B90 - B10) \times 40$ ps.

Falltime

13. Set Data B to 255 (10.2 ns).
14. Set Data A to 235 (141.0 ns) = t start fall, read voltage Vf.
15. If $Vf > V10$, increment Data A until $Vf < V10$.
16. If $Vg < V10$, increment Data B until $Vf > V10$.
17. Increment Data B by one bit, store Data B as B1.
18. Decrement Data B until $Vf > V90$.
19. Increment Data B by one bit, store Data B as B9.
20. Calculate $tf = (B1 - B9) \times 40$ ps.

Test data taken on the tripe CRT driver LH2426 available from National Semiconductor Corporation, which has risetimes and falltimes of about 3.5 ns, show good correlation to the test data taken with a Hewlett-Packard Digital Oscilloscope model HP54120A(20 GHz BW, 6 GHz 10:1 probe). Results were on the average accurate within 3 to 4%. Repeatability of the system was tested by measuring the same DUT forty times. The results were consistent within ±80 ps.

Improvements are possible with refinements in the software. For example, where excessive tilt or ringing is present on a waveform, a more accurate average value for the bottom and top voltage is obtained by averaging, that is a number of measurements are taken at different locations on the waveform and the average value is extracted mathematically by well known methods.

To avoid a false test result when ringing in excess of the 10% or 90% voltage value is encountered a simple program algorithm is used to probe one or more coarse time delay bits beyond the 10% or 90% value. If the following voltage readings are higher in value, the correct starting point for risetime or falltime measurement has been found.

For the specific purpose of fast risetime/falltime measurement or where single insertion testing of risetime/falltime and DC parameters is desirable, the teachings of the present invention provide a solution which is much more economical than a $30,000 or more commercial alternative available in the prior art. Total cost of material for the Square Wave Generator, Timing Generator, and a DUT interface is less than approximately $150, excluding the controller, power supplies and the DVM.

All publications and patent applications mentioned in this specification are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A system for measuring an electronic signal from a device under test (DUT) comprising:
   a generator for generating a repetitive input signal of a desired frequency;
   means for applying said input signal to one or more input leads of said DUT;
   a timing generator comprising:
      an input port for receiving said repetitive input signal;
      a pulse generator having an input lead connected to said input port of said timing generator and an output lead for providing a repetitive pulse signal in response to said repetitive input signal;
      a precision coarse delay circuit having an input lead connected to said output lead of said pulse generator, a digital control port for receiving a coarse delay control signal, and an output lead for providing a coarse delayed pulse signal as a function of said repetitive pulse signal and said coarse delay control signal;
      a precision fine delay circuit having an input lead connected to said output lead of said precision coarse delay circuit, additional control port for receiving a fine delay control signal, and an output lead for providing a fine delayed pulse signal as a function of said coarse delayed pulse signal and said fine delay control signal; and
      an output port connected to said output lead of said precision fine delay circuit for providing timing signals as a function of said input signal and said coarse and fine delay control signals;
   a high frequency voltage sampler having a signal input port coupled to an output lead of said DUT for receiving an output signal of said DUT which is to be measured, a timing signal input port coupled to said output port of said timing generator, and an output port for providing an output signal indicative of the level of said DUT output signal at a sampling time defined by said timing signals from said timing generator; and
   means for measuring said output signal of said high frequency voltage sampler.

2. A device as in claim 1 wherein said precision coarse and fine delay circuits each comprise one or more programmable delay elements.

3. A device as in claim 1 wherein said means for measuring comprises a voltmeter.

4. A device as in claim 1 wherein said means for measuring comprises a computerized test system.

5. A method of measuring the rate of change of an electronic signal from a device under test (DUT) comprising the steps of:
   generating a repetitive input signal of desired frequency;
   applying said repetitive input signal to one or more input leads of said DUT;
   generating a voltage measurement enable signal indicating the time at which a voltage measurement should be made of the output signal of said DUT by the steps of:
      generating a repetitive pulse in response to said repetitive input signal;
      generating a precision coarse delayed pulse as a function of said repetitive pulse signal and a coarse delay control signal;
      generating a precision fine delay pulse as a function of said precision coarse delayed pulse and a fine delay control signal, serving as said voltage measurement enable signal;
   utilizing a high-frequency voltage sampler for measuring the output signal of said DUT at the time defined by said voltage measurement enable signal; and
   measuring the output signal of said high-frequency voltage sampler.

6. A method as in claim 5 wherein said step of providing said voltage measurement enable signal comprises the step of providing, in sequence, a plurality of voltage measurement enable signals each defining an appropriate time at which to measure the voltage of said output signal of said DUT such that the time associated with a predetermined voltage level may be determined.

7. A method as in claim 6 wherein the time between two or more of said predetermined voltage levels is determined.

* * * * *